United States Patent [19]
Mikagi

[11] Patent Number: 5,595,937
[45] Date of Patent: Jan. 21, 1997

[54] METHOD FOR FABRICATING SEMICONDUCTOR DEVICE WITH INTERCONNECTIONS BURIED IN TRENCHES

[75] Inventor: Kaoru Mikagi, Tokyo, Japan

[73] Assignee: NEC Corporation, Tokyo, Japan

[21] Appl. No.: 635,230

[22] Filed: Apr. 12, 1996

[30] Foreign Application Priority Data

Apr. 13, 1995 [JP] Japan .................................. 7-111053

[51] Int. Cl.$^6$ ..................... H01L 21/283; H01L 21/311
[52] U.S. Cl. .................... 437/192; 437/195; 437/203; 437/978
[58] Field of Search .................... 437/190, 192, 437/195, 203, 228 S, 944, 978; 257/752, 760

[56] References Cited

U.S. PATENT DOCUMENTS

| | | | |
|---|---|---|---|
| 4,997,790 | 3/1991 | Woo et al. | 437/195 |
| 5,026,666 | 6/1991 | Hills et al. | 437/195 |
| 5,037,777 | 8/1991 | Mele et al. | 437/195 |
| 5,158,910 | 10/1992 | Cooper et al. | 437/195 |
| 5,266,526 | 11/1993 | Aoyama et al. | 437/195 |
| 5,356,834 | 10/1994 | Sugimoto et al. | 437/190 |
| 5,482,894 | 1/1996 | Havemann | 437/195 |

OTHER PUBLICATIONS

M. Sekine et al.; "Self–Aligned Tungsten Strapped Source/Drain and Gate Technology Realizing the Lowest Sheet Resistance for Sub–quarter Micron CMOS"; IEDM Tech. Digest, Dec. 1994, pp. 493–496.

H. Watanabe et al.; "A New Cylindrical Capacitor Using Hemispherical Grained Si (HSG–Si) for 256Mb DRAMs"; IEDM Tech. Digest, Dec. 1992, pp. 259–262.

J. S. H. Cho et al.; "Copper Interconnection with Tungsten Cladding for ULSI"; Technical Digest of Symposium on VLSI Technology, May 28–30, 1991, pp. 39–40.

S. Lakshminarayanan et al.; "Dual Damascene Copper Metallization Process Using Chemical–Mechanical Polishing"; Proceedings of VLSI Multilevel Interconnection Conference (VMIC—1994), Jun. 7–8, 1994, pp. 49–50.

D. C. Edelstein et al.; "Picosecond Propagation on Multilevel Copper–Polyimide Back End of the Line Interconnections"; Proceedings of VLSI Multilevel Interconnection Conference (VMIC—1993), Jun. 8–9, 1993, pp. 511–513.

*Primary Examiner*—T. N. Quach
*Attorney, Agent, or Firm*—Whitham, Curtis, Whitham & McGinn

[57] ABSTRACT

A silicon oxide film is formed on a silicon substrate with a diffusion layer, and a contact hole is formed in the silicon oxide film. A protective film made of an oxide film and a nitride film is formed over the whole surface of the substrate, and the contact hole is buried with a BPSG film. Another silicon oxide film is deposited over the substrate and an interconnection trench is formed in this silicon oxide film. After the BPSG film is removed, a TiN/Ti film is formed over the whole surface of the substrate. A Cu film is grown by MO–CVD, and thereafter the Cu film and TiN/Ti film on the surface of the substrate are partially removed by CMP. A highly reliable contact plug and a trench burying higher level interconnection are formed even where contacts are margin-less or where alignment errors are present.

7 Claims, 8 Drawing Sheets

5,595,937

METHOD FOR FABRICATING SEMICONDUCTOR DEVICE WITH INTERCONNECTIONS BURIED IN TRENCHES

BACKGROUND OF THE INVENTION (1) Field of the Invention

The present invention relates to a semiconductor device, and more particularly to a method for fabricating a semiconductor device having interconnections buried in trenches.

(2) Description of the Related Art

Aluminum (Al) based alloy is now widely used as the interconnection material of semiconductor devices, because Al has a relatively low resistivity and fine interconnections can be formed by dry etching. However, as semiconductor devices are scaled down and the interconnection width is reduced, there arise problems such as degraded performance of semiconductor devices due to high resistance of interconnections or breakage in interconnections due to electromigration and stressmigration.

In contrast, copper (Cu) has a lower resistivity, higher melting point, and higher electromigration and stressmigration resistance than Al. Therefore, low resistance interconnections and long lifetime can be expected so that Cu is the leading candidate to replace Al as the interconnection material. However, as compared to Al, the disadvantages associated with Cu are difficulties of dry etching Cu and forming fine interconnections. To solve this problem, a trench burying Cu interconnection technology has been proposed. This trench burying interconnection technology aims to form high planar and low resistance multilevel Cu interconnections, without using a dry etch of Cu.

FIGS. 1A to 1D are cross sectional views sequentially illustrating a process flow of a method of forming a trench burying Cu interconnection, this technology being described in "Technical Digest of Symposium on VLSI Technology", by J. S. H. Cho et al., pp. 39–40 (1991).

As shown in FIG. 1A, an interconnection trench 209a is formed in a silicon oxide film 202b formed on a silicon substrate 201, and thereafter a TiW film 210a is formed. Next, as shown in FIG. 1B, photoresist (PR) is coated and etched back to leave a PR mask 212 and a TiW film 210a in the interconnection trench 209a.

As shown in FIG. 1C, after the PR mask 212 is removed, silicon nitride is deposited and etched back to form a spacer of a silicon nitride film 213 on the side wall of the interconnection trench. Then, as shown in FIG. 1D, a tungsten (W) film 210b, a Cu film 211a, and a W film 210c are sequentially formed in the interconnection trench to thereby form a trench burying interconnection having Cu as its main conductive layer.

Also in the above cited paper "Technical Digest of Symposium on VLSI Technology", by J. S. H. Cho et al., p. 39 (1991), two contact structures to a diffusion layer are described. FIGS. 2A and 2B are cross sectional views of the contact structures.

In the structure shown in FIG. 2A, a diffusion layer 203a is formed in the region surrounded by a field oxide film 202a, a contact hole 205a is formed in a silicon oxide film 204 formed on the diffusion layer 203a, and a W film 210b, a Cu film 211a, and a W film 210c are sequentially formed in the contact hole. In the other structure shown in FIG. 2B, after a W film 210b is formed on a diffusion layer 203a, a silicon oxide film 204 is deposited and a contact hole 205a is formed therein. Thereafter, a Cu film 211a and a W film 210c are sequentially formed in the contact hole.

Multilevel trench burying Cu interconnections have been proposed by S. Lakshminarayanan et al. in "Proceedings of VLSI Multilevel Interconnection Conference (VMIC)", at pp. 49–55 (1994). FIGS. 3A–3H are cross sectional views and plan views illustrating a sequence of processes.

As shown in FIG. 3A, a lower level interconnection trench 209b is formed in a silicon oxide film 202b formed on a silicon substrate 201. Next, as shown in FIG. 3B, after a titanium (Ti) film 210e is formed, Cu is deposited by Chemical Vapor Deposition (CVD) to fill the lower level interconnection trench 209b with a Cu film 211b. Next, as shown in FIG. 3C, the Cu film 211b and Ti film 210e over the silicon oxide film 202b are partially removed by Chemical Mechanical Polishing (CMP) so as to form a lower level interconnection 203b in the lower level interconnection trench 209b, the lower level interconnection 203b being constituted by the Ti film 210e and Cu film 211b. A silicon oxide film 204 is deposited over the lower level interconnection 203b and, thereafter, an interconnection trench 209a is formed in the silicon oxide film 204.

With the above processes, the positional relationship between the lower level interconnection 203b and interconnection trench 209a becomes as shown in FIG. 3D assuming that there is no alignment error or size error (size error between an actual pattern and its mask pattern). As shown in FIG. 3E, a through-hole 205b is formed in the silicon oxide film 204 in the area of the interconnection trench 209a, reaching the surface of the lower level interconnection 203b. After the above processes, the positional relationship among the lower level interconnection 203b, interconnection trench 209a, and through-hole 205b becomes as shown in FIG. 3F. Next, as shown in FIG. 3G, after a Ti film 210d is formed, a Cu film 211a is deposited by CVD.

As shown in FIG. 3H, the Ti film 210d and Cu film 211a over the silicon oxide film 204 are partially removed by CMP to form both a Cu contact plug and a trench burying Cu interconnection at the same time on the lower level interconnection 203b.

Forming a contact plug or lower level interconnection through CMP is called a Damascene process. Forming a contact plug and trench burying interconnection by a single CMP process at the same time is called a dual Damascene process.

Although not shown in drawings, forming multilevel trench burying Cu interconnections by the dual Damascene process is reported in "Proceedings of VLSI Multilevel Interconnection Conference (VMIC)", by D. C. Edelstein et al., at pp. 511–513 (1993). In this paper, trench burying Cu interconnections of three or more layers are realized by using polyimide as an insulating film, in the manner similar to S. Lakshminarayanan et al.

A trench burying Cu interconnection proposed by J. S. H. Cho et al. is formed by leaving a TiW film only in the interconnection trench by an etchback process using photoresist as an etching mask, by forming a side wall silicon nitride film, and thereafter by sequentially forming a W film, a Cu film, and a W film in the interconnection trench. Accordingly, this method requires a number of interconnection forming processes as compared to the Damascene process, resulting in an increased manufacturing cost. Furthermore, a W film is formed by a selective W-CVD process which requires high process precision so that a high production yield is difficult.

The two contact structures proposed in the same paper by J. S. H. Cho et al. are also associated with the severe problems that a manufacturing cost is increased and a high production yield is difficult.

As compared to the method given by J. S. H. Cho et al., the Damascene method used by S. Lakshminarayanan et al. is simple and has less processes, and easy to control processes because stable processes are used. However, with the dual Damascene method for multilevel interconnections by which a plug for a contact hole (inclusive of a through-hole) and a trench burying interconnection are formed at the same time, the contact hole is formed after the interconnection trench is formed so that photoresist for the contact hole cannot be coated uniformly because of steps of the interconnection trench.

A change in the film thickness of photoresist does not have a significant affect much if there is a large margin between a contact hole and an interconnection trench or if a large pattern is used. However, for a margin-less contact (contact hole, diffusion layer, and interconnection of the same size) or a fine pattern, it is difficult to satisfy the requirements of high alignment precision. In addition, a pattern size error caused by exposure becomes large and pattern deformation easily occurs.

FIGS. 4A to 4F are cross sectional views and plan views illustrating the process flow corresponding to the second conventional technique in which a margin-less contact is used, while comparing the cases with and without an alignment error.

As shown in FIG. 4A, if there is neither a size error nor an alignment error when a through-hole 205b is formed after an interconnection trench 209a is formed in a silicon oxide film 204 on a lower level interconnection 203b, then the positional relationship among the lower level interconnection 203b, through-hole 205b, and interconnection trench 209a becomes ideal as shown in FIG. 4B. Accordingly, after a Ti film 210d and a Cu film 211a are deposited and subjected to CMP, a trench burying Cu interconnection of two layers is formed as being margin-less as shown in FIG. 4C.

It is generally difficult to perform a patterning process without any alignment and size error. The reasons of the occurrence of a size error may be as follows: 1) If a thickness of a photoresist film is uneven, a smaller pattern is formed at the thick area and a larger pattern is formed at a thin area; 2) If different widths of patterns are used, a wider pattern is made even more wider whereas a narrower pattern is made even more narrower; and 3) If there is a distortion of an exposure lens, the pattern size is made different depending upon the position on a wafer.

As shown in FIG. 4D, assuming that there is an alignment error during an exposure process for forming a through-hole, the positional relationship among the lower level interconnection 203b, through-hole 205b, and interconnection trench 209a becomes as shown in FIG. 4E. In this case, even the silicon oxide film 202b at the side of the lower level interconnection 203b may be over-etched when the through-hole is opened. This over-etch degrades the shape of the through-hole and so a void is easily formed when a metal film is filled in the interconnection trench. Worse still, this over-etch may cause the through-hole to reach the substrate or lower level interconnection so that an electrical short occurs. This makes it impossible to attain a good electrical performance and high production yield. Similar problems also occur when there is a size error during the exposure process for a through-hole (contact hole), so that a good electrical performance and high production yield are impossible.

SUMMARY OF THE INVENTION

It is an object of the present invention to overcome the problems existing in the prior art, and to provide, with ease and at a low cost, a highly reliable contact structure even where there is no margin among a diffusion layer, a lower level interconnection, and a contact hole (through-hole) or between a contact hole (through-hole) and a higher level interconnection, and even where there is any alignment or size error during patterning these elements.

According to one aspect of the invention, there is provided a method for fabricating a semiconductor device comprising the steps of:

a) forming a first insulating film covering one of a diffusion layer formed in a surface region of a semiconductor substrate and a lower level interconnection layer formed over the semiconductor substrate;

b) forming an opening in the first insulating film, one of the opening exposing a surface of the diffusion layer and the lower level interconnection layer;

c) forming a protective film covering an inside of the opening and a surface of the first insulating film;

d) forming a planar film by burying a material in the opening, the material capable of being selectively removed relative to the protective film;

e) forming a second insulating film covering the planar film and the first insulating film;

f) forming an interconnection trench by selectively etching the second insulating film, the interconnection trench exposing a surface of the planar film;

g) removing the planar film;

h) exposing the surface of one of the diffusion layer and the lower level interconnection by removing the protective film at least at a bottom area of the opening; and i) forming a conductive film burying the opening and the interconnection trench.

According to the method for fabricating a semiconductor device of this invention, the insulating film is formed on the contact hole filled with the protective film and the planar film, the interconnection trench is formed in the insulating film, and after the planar film and protective film are removed, the conductive film is deposited burying the contact hole and interconnection trench. Since the interconnection trench can be formed under the condition that there is no step, it can be formed at high precision. Further, since the interconnection trench is formed and the planar film is removed respectively while leaving the protective film in place, deformation of the interconnection trench and contact hole can be suppressed even if there are alignment and size errors. According to the invention, therefore, a fine contact plug and trench burying interconnection can be formed at high precision and with high reproductivity even for a margin-less contact, without any void or electrical short. Fine semiconductor devices of high performance, high reliability, and thus long lifetime can be manufactured with high manufacturing yield.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be described with reference to the accompanying drawings.

First Embodiment

FIGS. 5A to 5H are cross sectional views (with FIG. 5E being a top view) illustrating a sequence of fabrication processes according to a first embodiment of the invention.

Figure 1A:
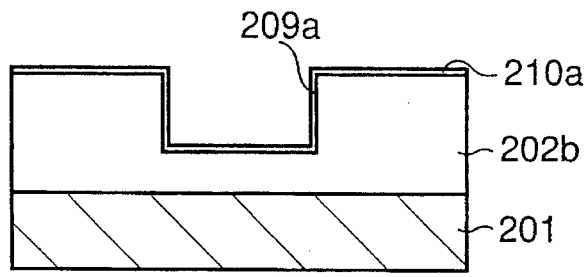
FIGS. 1A to 1D are cross sectional views illustrating a sequence of processes according to a first conventional technique.
Figure 1B:
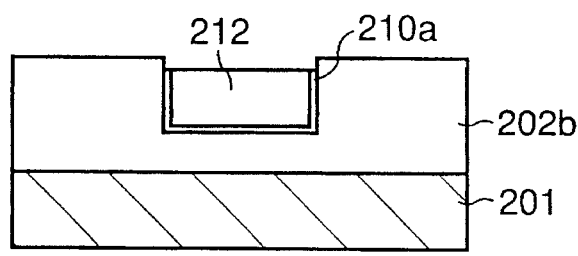
Figure 1C:
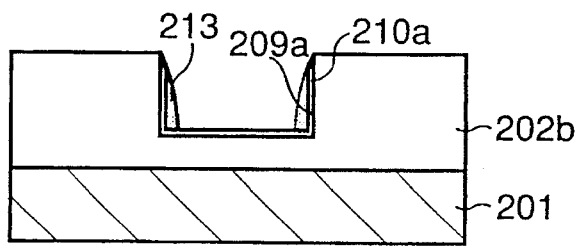
Figure 1D:
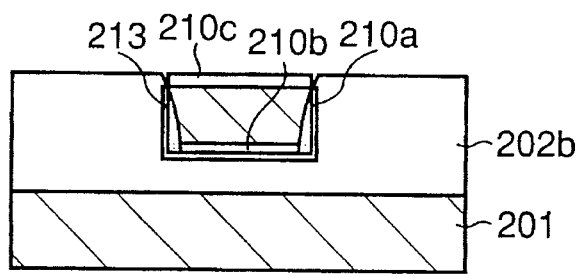
Figure 2A:
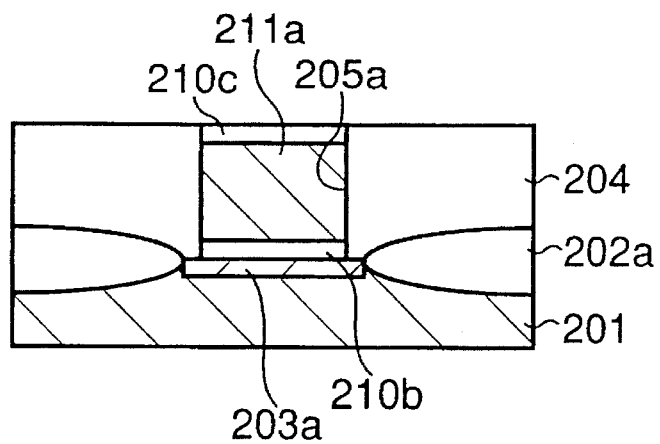
FIGS. 2A and 2B are cross sectional views showing modifications of the first conventional technique.
Figure 2B:
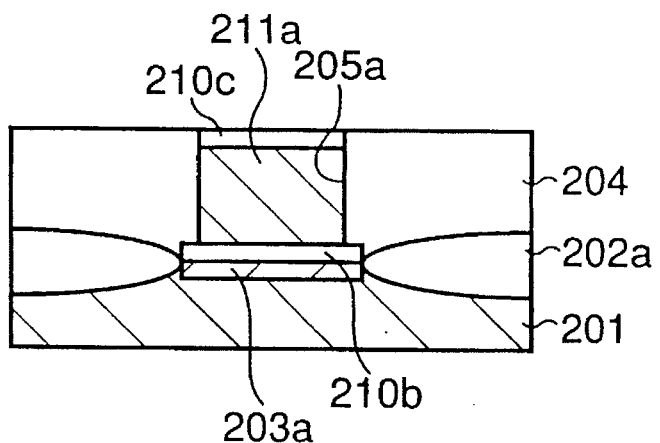
Figure 3A:
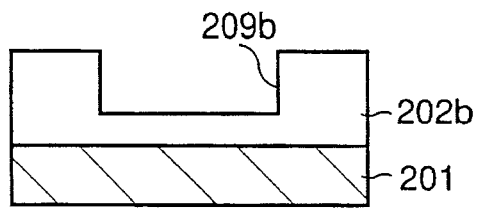
FIGS. 3A to 3H are cross sectional views (with FIGS. 3D and 3F being top views) illustrating a sequence of processes according to a second conventional technique.
Figure 3B:
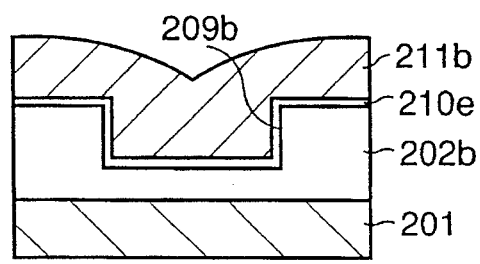
Figure 3C:
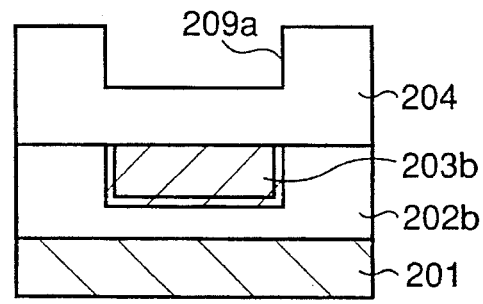
Figure 3D:
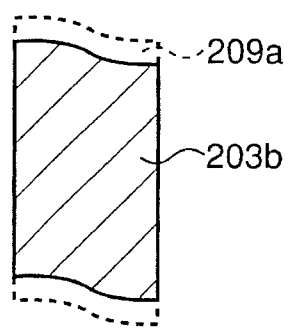
Figure 3E:
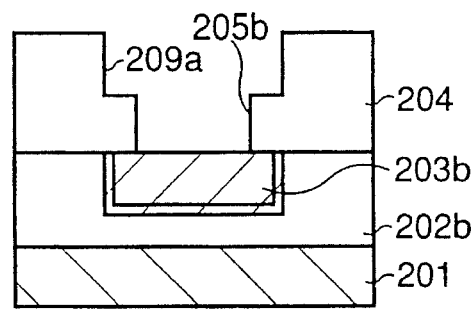
Figure 3F:
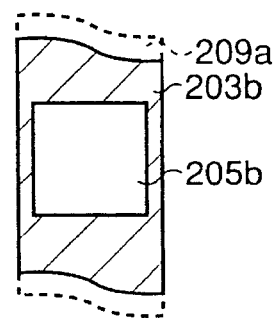
Figure 3G:
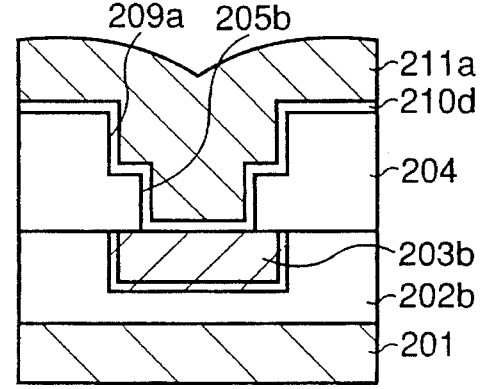
Figure 3H:
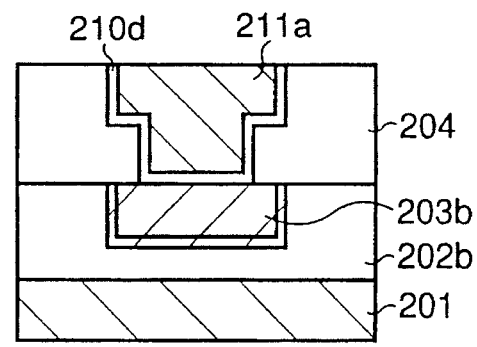
Figure 4A:
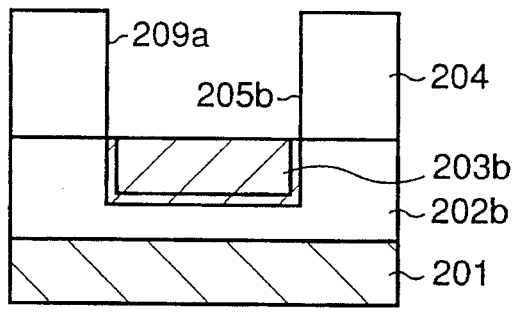
FIGS. 4A to 4F are cross sectional views (with FIGS. 4B and 4E being top views) illustrating a sequence of processes of the second conventional technique with and without alignment and size errors.
Figure 4D:
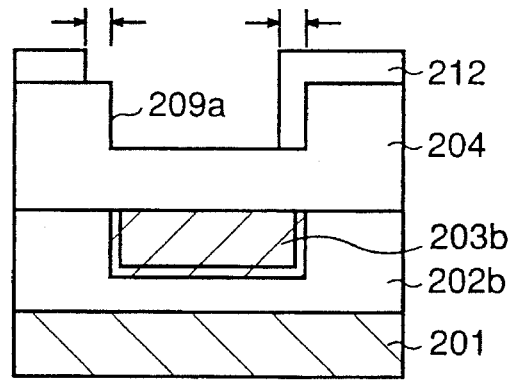
Figure 4B:
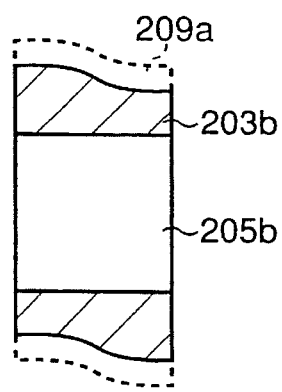
Figure 4E:
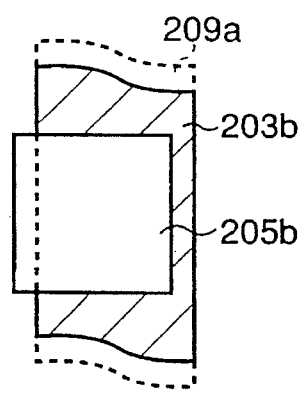
Figure 4C:
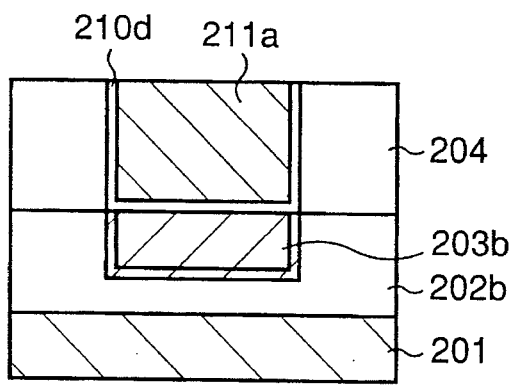
Figure 4F:
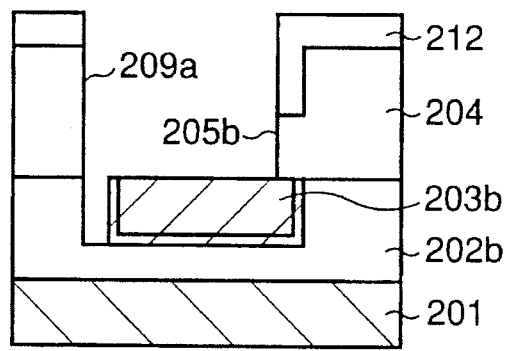
Figure 5A:
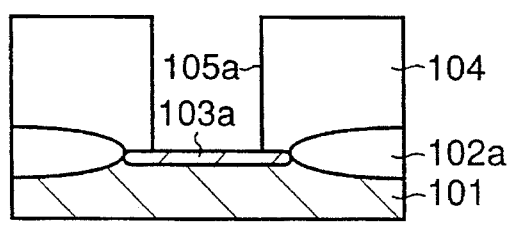
FIGS. 5A to 5H are cross sectional views (with FIG. 5E being a top view) illustrating a sequence of processes according to a first embodiment of the invention.

First, as shown in FIG. 5A, on a silicon substrate 101 of a p-conductivity type, a field oxide film 102a of a silicon oxide film is formed to a thickness of 400 nm by well known thermal oxidation. After arsenic (As) ions are implanted to a concentration of about $5 \times 10^{15}$ cm$^2$, the substrate is subjected to a thermal activation process for 20 minutes at 900° C. in a nitrogen atmosphere to form a diffusion layer 103a of an n-conductivity type and about 150 nm thick.

A silicon oxide film 104 of a first insulating film is deposited over the substrate to a thickness of 1000 nm by thermal CVD using SiH$_4$ (monosilane) as a source gas. The silicon oxide film 104 is selectively etched through dry etching using a photoresist as an etching mask to form a contact hole 105a of 150 to 500 nm diameter reaching the diffusion layer 103a.

Figure 5E:
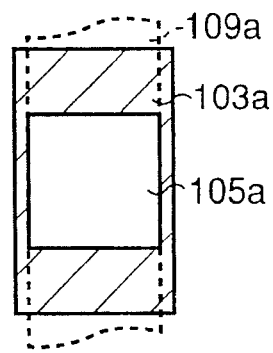
Figure 5B:
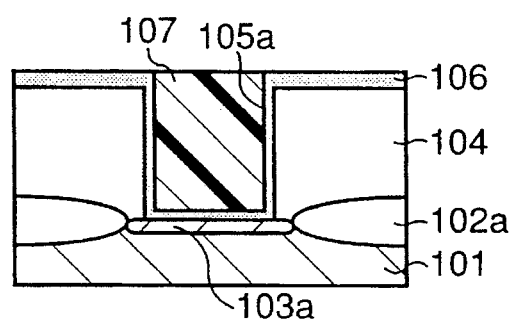

Next, as shown in FIG. 5B, a silicon oxide film of 20 nm thick and a silicon nitride film of 30 nm thick are sequentially deposited in this order on the silicon oxide film 104 and contact hole 105a by thermal CVD thereby forming a protective film 106 made of these two-layer films.

The silicon nitride film functions as an etching stopper for the silicon oxide film when an interconnection trench pattern is formed at a later process, as a selective etching stopper for a borophosphosilicate glass (BPSG) film to be formed at a later process, and as a barrier film for preventing impurities such as boron (B) and phosphorus (P) from being diffused from the BPSG film into the diffusion layer 103a. The silicon oxide film under the silicon nitride film functions as a reserved protective film when the silicon nitride film is removed at the etching process for forming the interconnection trench pattern, and as a protective film for the diffusion layer and a lower level interconnection when the silicon nitride film is removed by wet etching at a later process using heated phosphoric acid solution. If the silicon nitride film functions as a perfect etching stopper or if the silicon nitride film is removed by dry etching, the silicon oxide film is not necessarily required. Furthermore, if the silicon oxide film can be formed sufficiently thick, a single layer structure of a silicon oxide film may be used.

Next, BPSG is deposited over the whole surface to form a BPSG film 107 of 500 nm thick which buries the inside of the contact hole 105a and serves as a planar film. The BPSG film 107 is formed by CVD using source gases containing monosilane, phosphine (PH$_3$), and diborane (B$_2$H$_6$). This planar film may be a phosphosilicate glass (PSG) film instead of the BPSG film.

The BPSG film over the silicon oxide film 104 is then removed by CMP or a known anisotropic etchback through reactive ion etching using fluorocarbon containing gas such as CHF$_3$. The BPSG film 107 only in the contact hole 105a is left unetched.

In removing the BPSG film by an etchback, this film is etched at such a high etching selectivity as allowing the underlying silicon nitride film to function as the etching stopper. Also in the CMP, the BPSG film is polished preferably at such a large polishing ratio of the BPSG film to the silicon nitride film as allowing the silicon nitride film to function as the stopper.

Figure 5F:
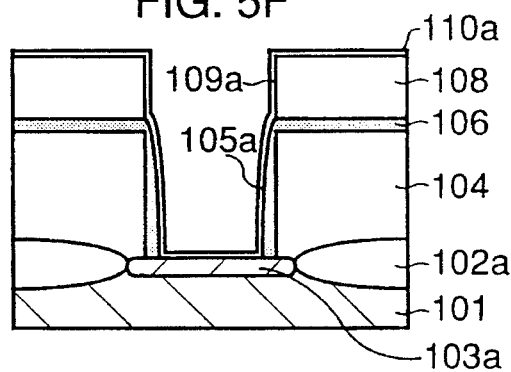
Figure 5C:
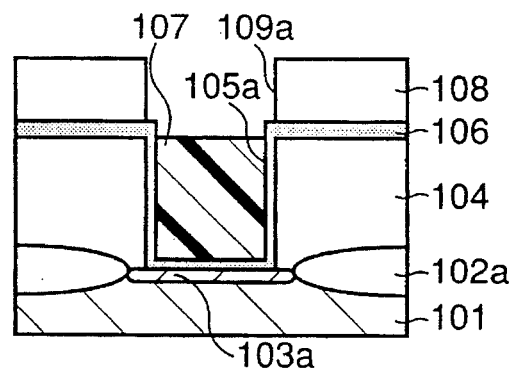

Next, as shown in FIG. 5C, a silicon oxide film 108 of a second insulating film is formed over the silicon substrate to a thickness of 500 to 1000 nm by plasma CVD using SiH$_4$ or tetra ethoxy silane (TEOS) as a source gas. An interconnection trench 109a is formed in this silicon oxide film 108 by reactive ion etching using a photoresist as an etching mask, the interconnection trench 109a having a width of 150 to 500 nm and a depth of 500 to 1000 nm. In this embodiment, a margin-less contact is used with the same widths of the contact hole 105a and interconnection trench 109a.

Also in this case, an etching rate ratio of the silicon oxide film to the silicon nitride film is set as high as possible to allow the silicon nitride film to function as the etching stopper and to make the cross sectional area of the interconnection trench 109a constant.

In the above photoresist (PR) process, the contact hole 105a is filled with the BPSG film 107 and so steps are not present. Therefore, photoresist can be coated at a high uniformity of film thickness. As compared to a conventional fabrication method, the size error of a pattern can be reduced and pattern deformation is not formed.

Figure 5G:
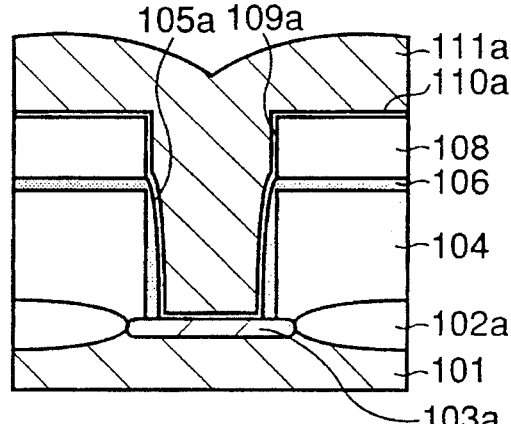
Figure 5D:
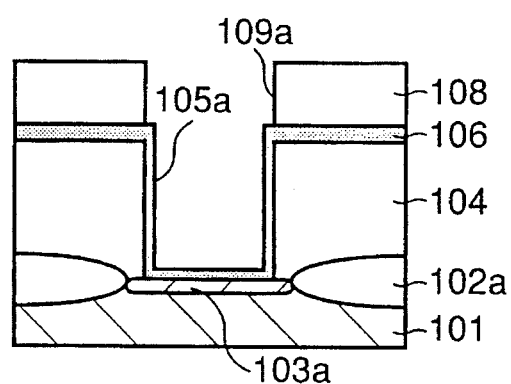

As shown in FIG. 5D, the silicon substrate 101 is exposed to HF (hydrogen fluoride) gas in a low pressure atmosphere of 500 to 1000 Pa to selectively etch and remove only the exposed BPSG film 107. Under these conditions, an etching rate ratio of the BPSG film to the silicon oxide film is 1000 or higher. Therefore, the planar film can be removed easily even if it is formed in a contact hole with a small diameter having a high aspect ratio.

The ability of selectively etching a BPSG film or PSG film by HF gas relative to a silicon oxide film has been shown by H. Watanabe et al. in "1992 International Electron Device Meeting (IEDM) Technical Digest", at p. 259 (1992). The ability of setting a high etching selectivity of a PSG film to even a silicon nitride film has been shown by M. Sekine et al. in "1994 International Electron Device Meeting (IEDM) Technical Digest", at p. 493 (1994) (the inventor of this invention is the co-presenter of this paper). Similarly, a high etching selectivity of a BPSG film to a silicon nitride film can be obtained easily.

Since a margin-less contact is used, after the above process, the positional relationship among the diffusion layer 103a, contact hole 105a, and interconnection trench 109a becomes as shown in FIG. 5E.

Next, as shown in FIG. 5F, a TiN/Ti film 110a of a first conductive film is formed over the whole surface by sputtering or CVD, the TiN/Ti film 110a having a titanium (Ti) film of 10 nm thick and a titanium nitride (TiN) film of 50 nm thick. Rapid thermal processing is then performed through lamp heating for 30 seconds at a temperature of 650° to 750° C. in a nitrogen atmosphere. This lamp heating process reacts the Ti film with the diffusion layer to silicidize titanium and reduce a contact resistance (silicidized titanium layer is not shown), and also to stabilize the TiN film structure on the Ti film and improve the barrier function.

In this embodiment, the first conductive film is made of a laminate of a Ti film and a TiN film. The invention is not limited thereto, but other single-layer conductive films or multilevel conductive films may also be used, such as films made of zirconium (Zr), hafnium (Hf), vanadium (V), tantalum (Ta), chromium (Cr), molybdenum (Mo), tungsten (W), alloy essentially consisting of these metals, nitride thereof, silicide thereof, carbide thereof, and boride thereof.

As shown in FIG. 5G, on the TiN/Ti film 110a, a Cu film 111a of a second conductive film is formed to a thickness of 300 to 1000 nm by metal organic CVD (MO-CVD) by using as a source gas Cu(HFA)(TMVS) (copper hexa fluoro athethyl acetonate tri-methyl vinyl silane, $Cu(C_5HF_6O_2)(C_5H_{12}Si)$), thereby filling the contact hole 105a and interconnection trench 109a with the TiN/Ti film and Cu film.

In order to form a Cu film having a planar surface and high step coverage, this MO-CVD process is performed under the conditions of: source gas flow rate of 20 to 50 sccm; carrier hydrogen gas flow rate of 50 to 200 sccm; temperature of 150° to 250° C.; and pressure of 5.0 to 20.0 Pa.

In this embodiment, the second conductive film is made of a Cu film. The material is not limited to Cu, but other low resistance metals may be used such as aluminum (Al), gold (Au), and silver (Ag). A method of forming a Cu film is not limited to a CVD method, but other physical film forming methods allowing a high step coverage may also be used such as a high temperature sputtering method and a reflow sputtering method, the former method forming a film by heating a substrate to a high temperature and maintaining a high fluidity of deposited metal, and the latter method forming a film by planarizing it by a high temperature heat treatment after sputtering.

Figure 5H:
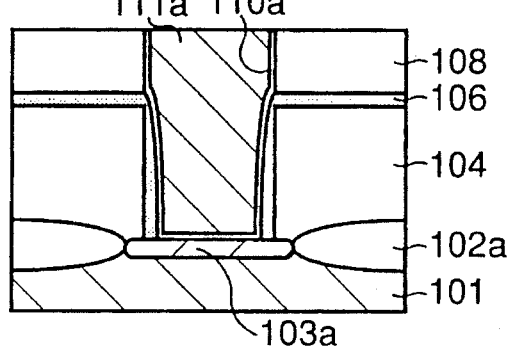

As shown in FIG. 5H, the Cu film 111a and TiN/Ti film 110a over the silicon oxide film 108 are partially removed by CMP using silica as a slurry to leave them only in the interconnection trench and contact hole.

Also in this case, the polishing rate ratio of the TiN/Ti film 110a to the silicon oxide film 108 is preferably set high to enhance the etching stopper function of the silicon oxide film 108.

With the above processes, a fine contact hole conductive member having low resistance Cu as its main conductive layer and a trench burying interconnection can be formed at the same time.

As described earlier, as semiconductor devices are scaled down and the margin among a contact hole, diffusion layer, and interconnect becomes small, there arises a possibility of a margin-less contact. An alignment error and a pattern size error are matters of importance to the margin-less contact.

If a conventional fabrication method is applied to a margin-less contact, photoresist for a contact hole formation cannot be coated uniformly because of steps of an interconnection trench pattern. Therefore, for a workpiece having steps such as shown in FIGS. 3A to 3H, it is difficult to maintain a pattern size precision to be high and a pattern deformation is easily generated. However, with the fabrication method of this invention, the PR process is performed on a planar substrate, allowing high size precision work. Furthermore, with the fabrication method of this invention, the conventional problems can be solved even if a high size precision is not obtained or there is an alignment error at the PR process for a margin-less contact.

In this invention, an interconnection trench is formed after a contact hole is formed so that the size error and the alignment error become more matters of greater importance to the PR process for forming the interconnection trench. FIGS. 6A to 6D are cross sectional views and a plan view illustrating a sequence of processes of the first embodiment in which a margin-less contact is formed under the presence of alignment and size errors.

Figure 6A:
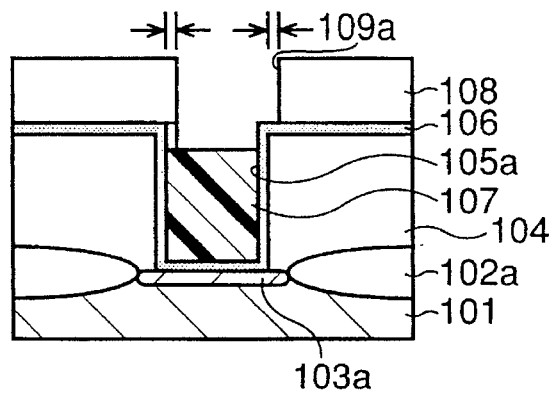
FIGS. 6A to 6D are cross sectional views (with FIG. 6B being a top view) illustrating the effects of the first embodiment of the invention.
Figure 6B:
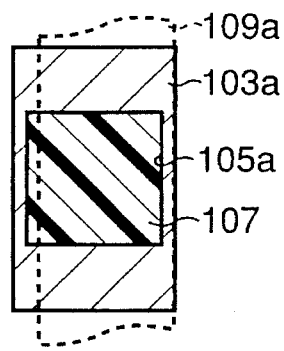

If there are alignment and size errors as shown in FIG. 6A when the PR process for forming an interconnection trench pattern is performed, the positional relationship among the diffusion layer 103a, contact hole 105a, and interconnection trench 109a becomes as shown in FIG. 6B. However, with the present invention, when the interconnection trench 109a is formed in the silicon oxide film 108, the silicon nitride film on the surface region of the underlying protective film 106 functions as the etching stopper, suppressing the formation of the inferior shape of the interconnection trench.

Figure 6C:
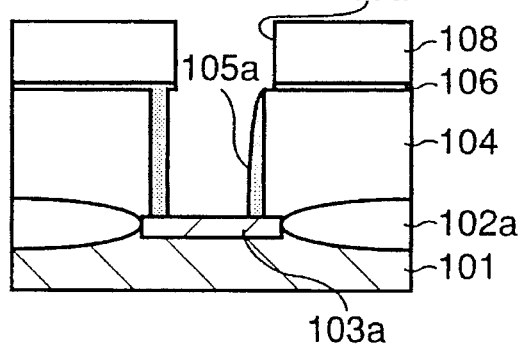

Furthermore, as shown in FIG. 6C, even under the structure that the BPSG film 107 is hidden under the silicon oxide film 108 or the protective film 106 on the silicon oxide film 104 is exposed, a residual BPSG film in the interconnection trench or the inferior shape thereof are very unlikely to be formed to the extent that a contact hole diameter is slightly reduced. The reason for this is that at the process of selectively removing the BPSG film 107 by HF gas, the silicon nitride film in the surface region of the protective film 106 has an etching selectivity sufficiently higher than the BPSG film 107 and the selective etching of the BPSG film progresses isotropically.

Figure 6D:
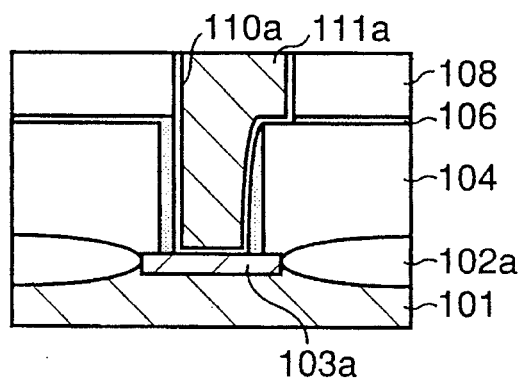

If there is an alignment error or other errors, a small shadowed portion or shelf portion is formed above the contact hole 105a under the silicon oxide film 108. Even in this case, this shadowed portion can be filled in by forming the TiN/Ti film 110a by CVD and forming the second conductive film by MO-CVD. Therefore, as shown in FIG. 6D, the contact hole and interconnection trench can be buried with the TiN/Ti film 110a and Cu film 111a without forming any void.

Second Embodiment

Now, a second embodiment of the present invention will be described with reference to FIGS. 7A to 7H. FIGS. 7A to 7H are cross sectional views and a plan view (FIG. 7E) illustrating a sequence of fabrication processes according to the second embodiment of this invention.

Figure 7A:
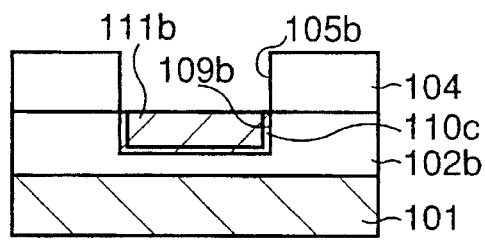
FIGS. 7A to 7H are cross sectional views (with FIG. 7E being a top view) illustrating a sequence of processes according to a second embodiment of the invention.

First, as shown in FIG. 7A, on a silicon substrate 101, a silicon oxide film 102b of a lower level insulating film is formed to a thickness of 800 to 1000 nm by CVD using $SiH_4$ as a source gas. A lower level interconnection trench 109b of 200 to 500 nm wide and 300 to 500 nm deep is formed in the silicon oxide film 102b by reactive ion etching by using a photoresist as an etching mask.

Next, a TiN film 110c is formed over the whole surface of the silicon substrate to a thickness of 30 nm by reactive sputtering. Thereafter, a Cu film 111b is deposited on the TiN film 110c to a thickness of 300 to 500 nm by MO-CVD and the metal film layers outside of the lower level interconnection trench 109b is polished and removed by CMP. In this manner, a lower level interconnection 103b is formed in the lower level interconnection trench 109b, the lower level interconnection 103b being constituted by the TiN film and Cu film and having a width of 200 to 500 nm and a film thickness of 300 to 500 nm.

A silicon oxide film 104 of 1000 nm thick is formed on the silicon oxide film 102b and lower level interconnection 103b by plasma CVD using $SiH_4$ or TEOS as a source gas. By using a photoresist as an etching mask, the silicon oxide film 104 is selectively etched by reactive ion etching to form a through-hole 105b reaching the lower level interconnection 103b and having the same opening diameter of 200 to 500 nm as the width of the lower level interconnection. In this embodiment, a margin-less contact is formed with the same sizes of the lower level interconnection and through-hole. Therefore if there is no alignment and size error, the through-hole is fully superposed upon the lower level interconnection (refer to FIG. 7E).

Figure 7B:
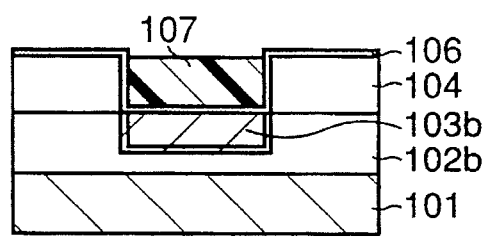

Next, as shown in FIG. 7B, on the silicon oxide film 104 and through-hole 105b, a protective film 106 is formed by CVD. The protective film 106 is a two-layer film formed by sequentially depositing a silicon oxide film of 10 to 30 nm thick and a silicon nitride film of 10 to 30 nm thick in this order. Then, BPSG is deposited 500 nm thick over the whole surface of the substrate by CVD using $SiH_4$, $PH_3$, and $B_2H_6$ as source gases to thereby form a BPSG film 107 as a planar film which is buried in the through-hole 105b. Also in this embodiment, a PSG film may be used instead of the BPSG film.

The BPSG film on the silicon oxide film 104 is removed by an etchback process using reactive ion etching or by CMP, while leaving the BPSG film 107 only in the through-hole 105b.

Figure 7C:
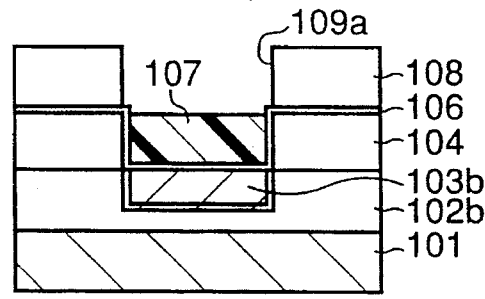

Next, as shown in FIG. 7C, a silicon oxide film 108 of a second insulating film is formed over the silicon substrate to a thickness of 500 to 1000 nm by plasma CVD using $SiH_4$ or TEOS as a source gas. An interconnection trench 109a is formed in the silicon oxide film 108 by reactive ion etching by using a photoresist as an etching mask. The interconnection trench 109a has the same width (200 to 500 nm) as the through-hole and a depth of 500 to 1000 nm. Also in this case, an etching rate ratio of the silicon oxide film to the silicon nitride film is set as high as possible so as to allow the silicon nitride film to function as the etching stopper and make the cross section of the interconnection trench constant.

During this PR process, the through-hole is already filled with the BPSG film so that there is no step. Therefore, photoresist can be coated at a high uniformity level of film thickness. As compared to a conventional fabrication method, a pattern size error unlikely occurs and pattern deformation does not exist.

Figure 7D:
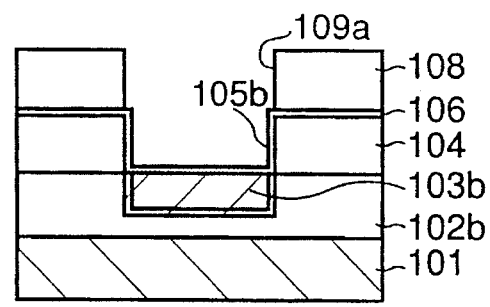

Next, as shown in FIG. 7D, the silicon substrate 101 is exposed to HF gas in a low pressure atmosphere of 500 to 1000 Pa to selectively etch and remove only the exposed BPSG film 107. Also in this case, as in the first embodiment, the etching rate ratio of the BPSG film to the silicon oxide film is very high. Therefore, this process can be applied even to a through-hole with a small diameter having a large aspect ratio.

Figure 7E:
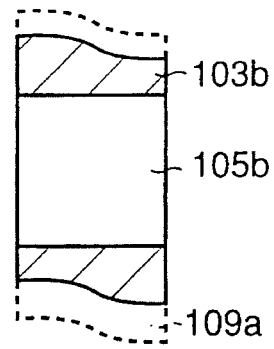

All the lower level interconnection 103b, through-hole 105b, and interconnection trench 109a formed by the above processes constitute the margin-less contact of the same size. Therefore, its positional relationship becomes as shown in FIG. 7E.

Figure 7F:
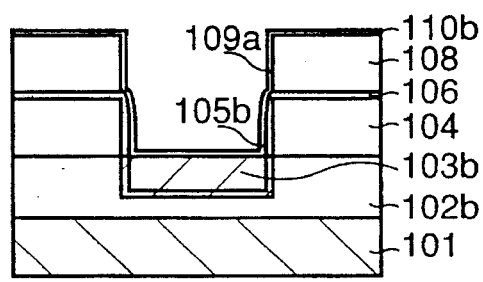

Next, as shown in FIG. 7F, a TiN film 110b of a first conductive film is formed over the whole surface of the substrate by sputtering or CVD.

In this embodiment, although the TiN film is used as the first conductive film, it is not limitative and other materials described in the first embodiment may be used.

Figure 7G:
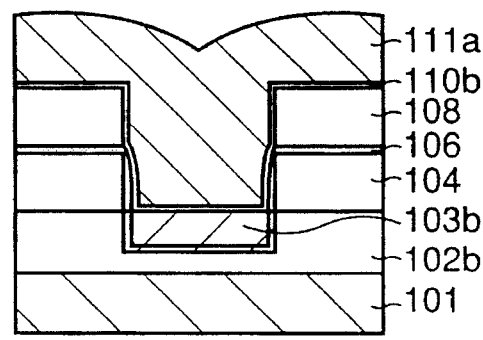

Next, as shown in FIG. 7G, a Cu film 111a of a second conductive film is formed on the TiN film 110b of the first conductive film to a thickness of 300 to 1000 nm by MO-CVD using Cu(HFA)(TMVS) as a source gas to fill the through-hole 105b and interconnection trench 109a with the TiN film 110b and Cu film 111a.

In order to form a Cu film having a planar surface and high step coverage, this MO-CVD process is performed under the conditions of: source gas at a flow rate of 25 to 50 sccm; carrier hydrogen gas at a flow rate of 100 to 250 sccm; temperature of 150° to 250° C.; and pressure of 5.0 to 10.0 Pa.

In this embodiment, the second conductive film is made of Cu. Similar to the first embodiment, this material is not limited to Cu, but other low resistance metals may be used such as Al, Au and Ag. A method of forming a Cu film is not limited to a CVD method, but other physical film forming methods allowing a high step coverage, such as a high temperature sputtering method and a reflow sputtering method, may also be used.

Figure 7H:
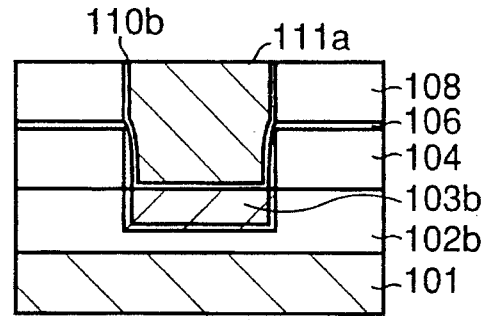

As shown in FIG. 7H, the Cu film 111a and TiN film 110b over the silicon oxide film 108 are partially removed by CMP to leave them only in the interconnection trench and through-hole.

With the above processes, a fine contact plug having low resistance Cu as its main conductive layer and a trench burying interconnect can be formed at the same time.

Also in the second embodiment, as compared to conventional examples, a size error unlikely occurs and there is no problem even when a size or alignment error is generated at a margin-less contact, like the first embodiment.

FIGS. 8A to 8E are cross sectional views and a plan view (FIG. 8C) illustrating a sequence of processes of the second embodiment in which a margin-less contact is formed under the presence of alignment and size errors.

Figure 8A:
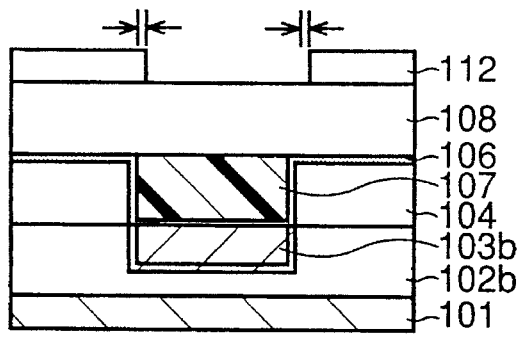
FIGS. 8A to 8E are cross sectional views (with FIG. 8C being a top view) illustrating the effects of the second embodiment of the invention.
Figure 8B:
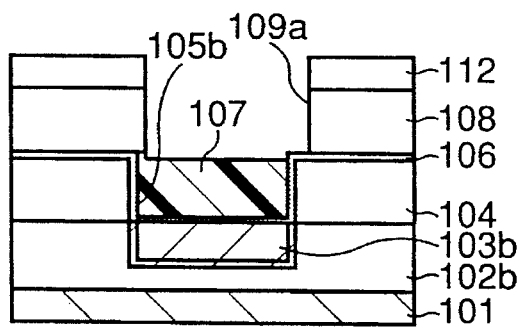

If there is an alignment error between the through-hole and the interconnection trench PR mask 112 as shown in FIG. 8A when the PR process for forming an interconnection trench pattern at a margin-less contact is performed, the BPSG film 107 exposed when the silicon oxide film 108 was etched is also etched as shown in FIG. 8B. However, the underlying silicon nitride film in the surface region of the protective film 106 functions as the etching stopper so that the shape of the interconnection trench does not become inferior.

Figure 8C:
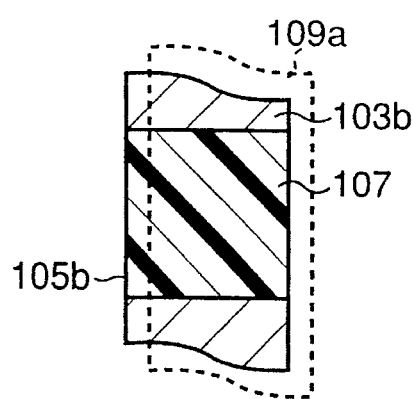

The positional relationship among the lower level interconnection 103b, through-hole 105b, and interconnection trench 109a when the interconnection trench is formed, becomes as shown in FIG. 8C, and a part of the BPSG film is hidden by the silicon oxide film 108.

Figure 8D:
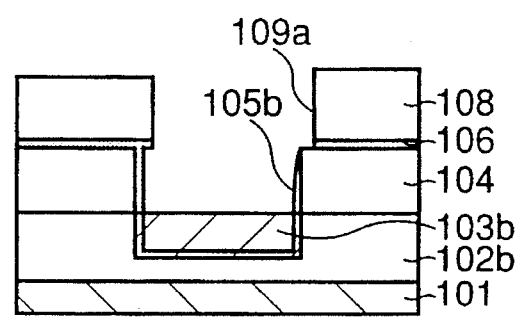

However, as shown in FIG. 8D, in the process of selectively etching the BPSG film 107 in the through-hole by HF gas, the etching progresses isotropically. Therefore, the BPSG film hidden under the silicon oxide film 108 can be removed. The shape of the through-hole is not deformed because the protective film 106 has an etching selectivity sufficiently higher than the BPSG film.

Figure 8E:
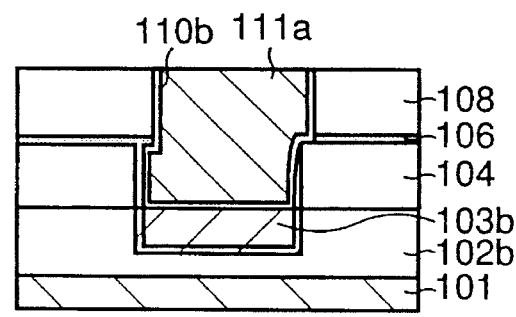

Therefore, as shown in FIG. 8E, even after the protective film is etched back and the metal film is filled in the interconnection trench 109a, the silicon oxide film on the lower level interconnection side will not be etched although only a small necked portion is formed at the boundary between the through-hole and interconnection trench. Accordingly, a Cu contact plug and Cu trench burying interconnection of high reliability and good shape can be formed at the same time without any likelihood of electrical shorts to a lower level diffusion layer and to other interconnection layers. For the above example, the case wherein an alignment error is present has been explained. No problem will occur either in the case of a size error, similar to an alignment error.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device comprising the steps of:

a) forming a first insulating film covering one of a diffusion layer formed in a surface region of a semiconductor substrate and a lower level interconnection layer formed over the semiconductor substrate;

b) forming an opening in said first insulating film, one of said opening exposing a surface of said diffusion layer and said lower level interconnection layer;

c) forming a protective film covering an inside of said opening and a surface of said first insulating film;

d) forming a planar film by burying a material in said opening, said material capable of being selectively removed relative to said protective film;

e) forming a second insulating film covering said planar film and said first insulating film;

f) forming an interconnection trench by selectively etching said second insulating film, said interconnection trench exposing a surface of said planar film;

g) removing said planar film;

h) exposing the surface of one of said diffusion layer and said lower level interconnection by removing said protective film at least at a bottom area of said opening; and i) forming a conductive film burying said opening and said interconnection trench.

2. A method for fabricating a semiconductor device according to claim 1, said protective film formed at said step c) is one of a silicon oxide film, a silicon nitride film, and a laminate of a silicon oxide film and a silicon nitride film.

3. A method for fabricating a semiconductor device according to claim 1, wherein said planar film formed at said step d) is one of a phosphosilicate glass (PSG) film, a borosilicate glass (BSG) film, and a borophosphosilicate glass (BPSG) film.

4. A method for fabricating a semiconductor device according to claim 1, wherein at said step g), said planar film is selectively removed by exposing said planar film to a hydrogen fluoride containing gas in a low pressure atmosphere.

5. A method for fabricating a semiconductor device according to claim 1, wherein said step i) of forming a conductive film comprises the steps of:

i-1) forming a first conductive layer over the whole surface of a resulting structure;

i-2) depositing conductive material on said first conductive layer to form a second conductive layer burying said opening and said interconnection trench; and i-3) removing said second conductive layer and said first conductive layer on said second insulating film.

6. A method for fabricating a semiconductor device according to claim 5, wherein said first conductive layer formed at said step i-1) is one of a single and a multilevel conductive film made of a material selected from the group consisting of titanium (Ti), zirconium (Zr), hafnium (Hf), vanadium (V), tantalum (Ta), chromium (Cr), molybdenum (Mo), tungsten (W), alloy essentially consisting of these metals, nitride thereof, silicide thereof, carbide thereof, and boride thereof.

7. A method for fabricating a semiconductor device according to claim 5, wherein said second conductive layer formed at said step i-2) is made of a material selected from the group consisting of aluminum (Al), copper (Cu), gold (Au), silver (Ag), and alloy essentially consisting of these metals.

* * * * *